United States Patent
Kuo et al.

(10) Patent No.: US 7,374,316 B2
(45) Date of Patent: May 20, 2008

(54) BACKLIGHT MODULE

(75) Inventors: Tzu-Shou Kuo, Hsinchu (TW); Pei-Ting Chen, Miaoli County (TW)

(73) Assignees: Coretronic Corporation, Miaoli County (TW); Young Lighting Technology Corporation, Hsinchu (TW)

( * ) Notice: Subject to any disclaimer, the term of this patent is extended or adjusted under 35 U.S.C. 154(b) by 0 days.

(21) Appl. No.: 11/436,571

(22) Filed: May 19, 2006

(65) Prior Publication Data

US 2006/0268580 A1  Nov. 30, 2006

(30) Foreign Application Priority Data

May 25, 2005  (TW) .............................. 94117121 A

(51) Int. Cl.
*F21V 7/04* (2006.01)

(52) U.S. Cl. ..................... 362/373; 362/800; 362/294; 362/632

(58) Field of Classification Search ............... 362/800, 362/294, 240, 235, 632
See application file for complete search history.

(56) References Cited

U.S. PATENT DOCUMENTS

| | | | | |
|---|---|---|---|---|
| 4,729,076 A | * | 3/1988 | Masami et al. ............. | 362/235 |
| 6,517,218 B2 | * | 2/2003 | Hochstein .................... | 362/294 |
| 6,641,284 B2 | * | 11/2003 | Stopa et al. ................. | 362/240 |
| 6,773,154 B2 | * | 8/2004 | Desai .......................... | 362/541 |
| 7,175,329 B1 | * | 2/2007 | Chou .......................... | 362/612 |
| 7,204,604 B2 | * | 4/2007 | Chou .......................... | 362/227 |
| 2006/0274528 A1 | * | 12/2006 | Chou et al. ................. | 362/294 |

FOREIGN PATENT DOCUMENTS

TW                229725              3/2005

* cited by examiner

*Primary Examiner*—Anabel M Ton
(74) *Attorney, Agent, or Firm*—Rosenberg, Klein & Lee

(57) ABSTRACT

A backlight module comprises a baseboard, at least one light-emitting element and a heat-dispersing member. The baseboard has at least one through-hole. The light-emitting element is installed in one of the through-holes and is electrically connected to a surface of the baseboard. The heat-dispersing member adjacent to the baseboard can contact the light-emitting elements directly.

16 Claims, 4 Drawing Sheets

US 7,374,316 B2

BACKLIGHT MODULE

RELATED APPLICATIONS

The present application is based on, and claims priority from, Taiwan Application Serial Number 94117121, filed May 25, 2005, the disclosure of which is hereby incorporated by reference herein in its entirety.

FIELD OF THE INVENTION

The present invention relates to a backlight module, and more particularly relates to a backlight module that applies a light-emitting diode (LED) as the lighting source.

BACKGROUND OF THE INVENTION

FIG. 1 illustrates a cross-sectional view of a backlight module in accordance with the prior art. The prior backlight module has a plurality of light-emitting elements 100', a substrate 400' and a metal circuit board 200' with a heat dispersing portion 300'.

The light-emitting elements 100' comprise LEDs electrically connected to the metal circuit board 200'. The metal circuit board 200' is fixed on one side of the substrate 400', wherein the heat dispersing portion 300' disposes on a surface of the metal circuit board 200' opposite to the substrate 400'.

Heat generated from the light-emitting elements 100' is directed to the heat dispersing portion 300' through an isolating material of the metal circuit board 200' and then dispersed by air. To enable highly efficient heat dissipation from the light-emitting element 100', a substance between the light-emitting element 100' and the heat dispersing portion 300' must exhibit good thermal conductivity. However, the isolating material of the metal circuit board 200' located between the light-emitting elements 100' and the heat dispersing portion 300' has high thermal resistance that resists heat conduction.

To resolve this, a substance with better thermal conductivity is applied to manufacture the metal circuit board 200', but doing so increases the cost of the metal circuit board 200' of the backlight module. Furthermore, a traditional display panel has other circuits, such as a circuit 601 ' used for driving the light-emitting elements 100' or a circuit 602' used for driving the panel. Each of the circuits must be configured on an individual substrate first and then assembled to the metal circuit board 200' and panel 500' via wires 700', respectively. Assembling these circuits consumes additional labor and space to manufacture a display panel, and the complex arrangement of the wires 700' causes the display panel to be difficult to maintain. In addition, the arrangement of the substrate 400' and the metal circuit board 200' causes the display panel to be too thick to comply with customer expectations.

Therefore, it is desirable to provide a thin backlight module with more thermal conductivity.

SUMMARY OF THE INVENTION

One of the objectives of the present invention is to provide a backlight module that eliminates unnecessary media to increase the efficiency of heat dissipation thereof.

The second objective of the present invention is to provide a thin backlight module.

Another objective of the present invention is to provide a backlight module having circuits integrated on a single baseboard to simplify wire arrangement.

In accordance with the preferred embodiments of the present invention, the backlight module comprises at least one light-emitting element, a baseboard and a heat-dispersing member. The baseboard includes at least one through-hole to allow the light-emitting element to be installed therein. The light-emitting elements are installed in the through-holes and are electrically connected to one surface of the baseboard via a connecting portion. The heat-dispersing member adjacent to the substrate has at least one protrusion portion and heat-dispersing fins. Each of the protrusion portions contacts one of the light-emitting elements installed in the through-holes of the substrate, so that heat generated by the light-emitting elements can be transferred to the heat-dispersing fins directly to increase the heat-dispersing efficiency of the backlight module.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
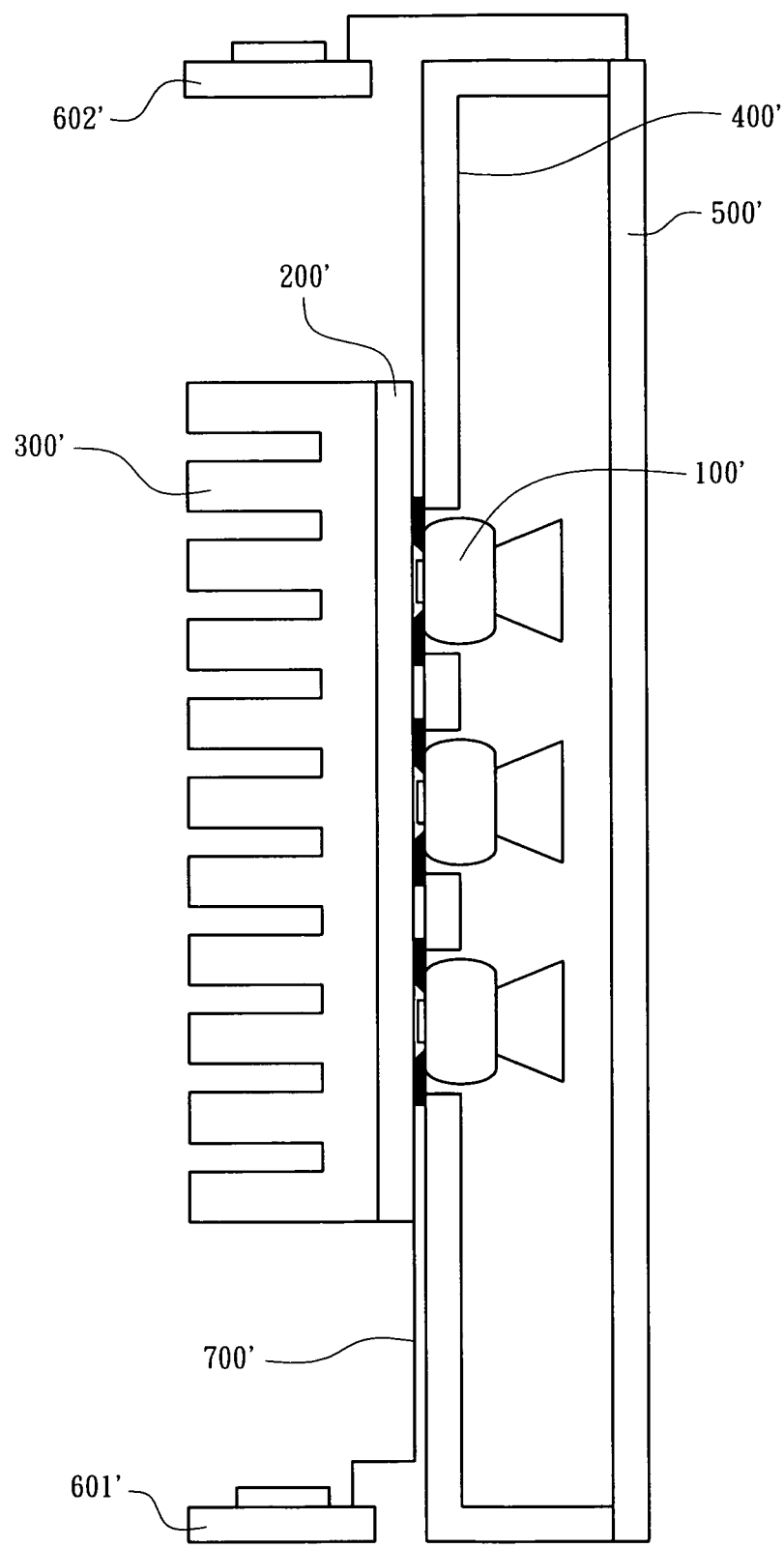
FIG. 1 illustrates a cross-sectional view of a backlight module in accordance with the prior art.
Figure 2:
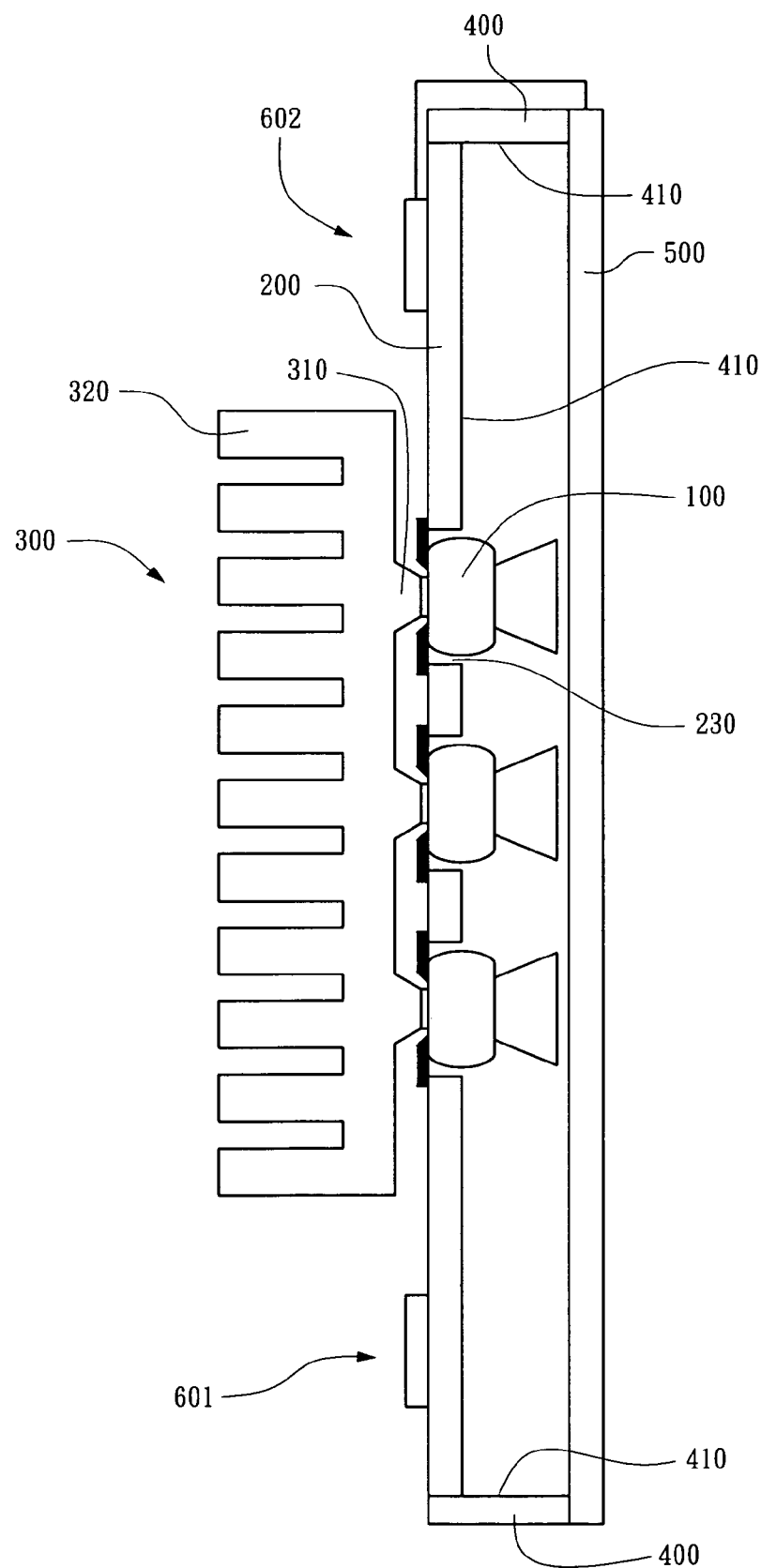
FIG. 2 illustrates a cross-sectional view of a backlight module in accordance with the first preferred embodiment of the present invention.

Referring to FIG. 2, a backlight module in accordance with the first preferred embodiment of the present invention is used for a display panel. The backlight module comprises light-emitting elements 100, a baseboard 200 and a heat-dispersing member 300. The light-emitting elements 100 each include at least one LED electrically connected to one surface of the baseboard 200 by an electrically connecting portion. The baseboard 200 has at least one through-hole 230 for each light-emitting element 100 to be installed therein, so that light emitted from the light-emitting elements 100 can shine on the display panel through the through-holes 230.

The heat-dispersing member 300 adjacent to the baseboard 200 has at least one protrusion 310 and at least one heat-dispersing fin 320. Each of the protrusion portions 310 contacts one of the light-emitting elements 100 installed in the through-holes 230 of the substrate 200, so that heat generated by the light-emitting elements 100 can be transferred to the heat-dispersing fins 320 directly. Each protrusion portion 310 preferably contacts the corresponding light-emitting element 100 in an area that does not emit light from the light-emitting element 100, so as to prevent interfering with illumination. For example, in the present embodiment each protrusion portion 310 contacts the button of the corresponding light-emitting element 100.

Figure 3:
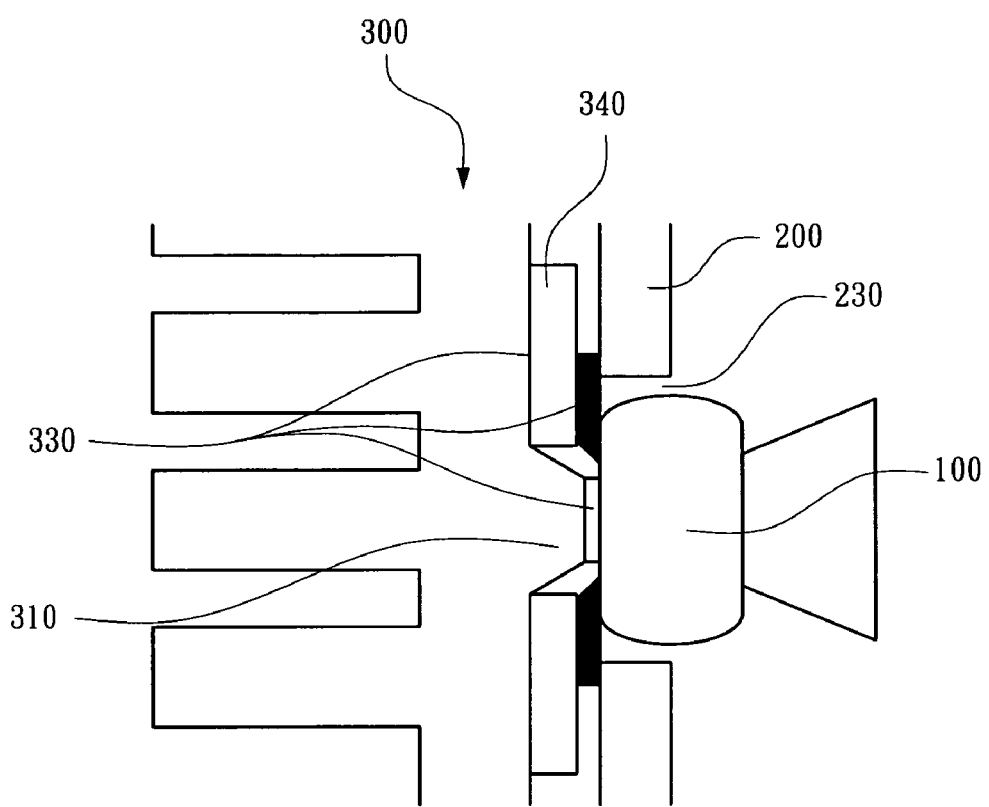
FIG. 3 is an enlarged cross-sectional view of a portion of the backlight module shown in FIG. 2.

Referring to FIG. 3, the present invention further comprise a thermally conductive and electrically insulating material 330 disposed between the protrusion portions 310 and the light-emitting elements 100 that improve the thermal conductivity between each protrusion portion 310 and corresponding light-emitting elements 100 so as to prevent thermal disequilibrium due to the manufacturing tolerance of the protrusion portions 310. The heat-dispersing fins 320 are arranged in suitable places of the heat-dispersing member 300 to increase the surface area for heat dispersing.

Of note is that an outer surface of the baseboard 200, which electrically contacts the connecting portion of the light-emitting elements 100, faces the heat-dispersing member 300. In addition, there is a distance between the heat-dispersing member 300 and each of the electrically connecting portions that connects the light-emitting element 100 to the baseboard 200. The distance prevents forming a short circuit once the connecting portion made of metal and the heat-dispersing member 300 are connecting. Furthermore, the distance allows air to flow through to enable better heat dissipation from the light-emitting elements 100.

The present embodiment further comprises another thermally conductive and electrically insulating material 340, such as mica sheet, disposed between the heat-dispersing member 300 and the electrically connecting portion of the light-emitting element 100 to increase the heat transferring area between the light-emitting elements 100 and the heat-dispersing member 300. The thermally conductive and electrically insulating material 330 can also be disposed between the electrically insulating material 340 and the electrically connecting portion of the light-emitting elements 100 to improve conductive effect.

In the preferred embodiment of the present invention, the backlight module further comprises a dark shield 400 surrounding the baseboard 200, wherein the baseboard 200 and the dark shield 400 define a box structure. An inner surface of the box structure is coated with a reflecting material 410 that is used to reflect the emitted light toward the desired direction.

Since the heat-dispersing member 300 contacts the light-emitting elements 100 directly, the heat generated by the light-emitting elements 100 can be transferred and dispersed through the heat-dispersing member 300 more effectively, and the baseboard 200 of the backlight module can be made of nonconductive materials, such as fiberglass and bakelite, so as to decrease manufacturing cost. Furthermore, due to its highly efficient heat dissipation, the baseboard 200 can be formed with a larger surface area to integrate the circuit 601 for driving the light-emitting elements 100 and the circuit 602 for driving the panel thereon. In addition, wires for connecting the individual circuits can be printed on the baseboard 200 to resolve the problems resulting from the complex arrangement of the wires.

In the process for assembling the backlight module, a surface mount technology (SMT) is applied to make electrical connections between the light-emitting elements 100 and the baseboard 200.

Figure 4:
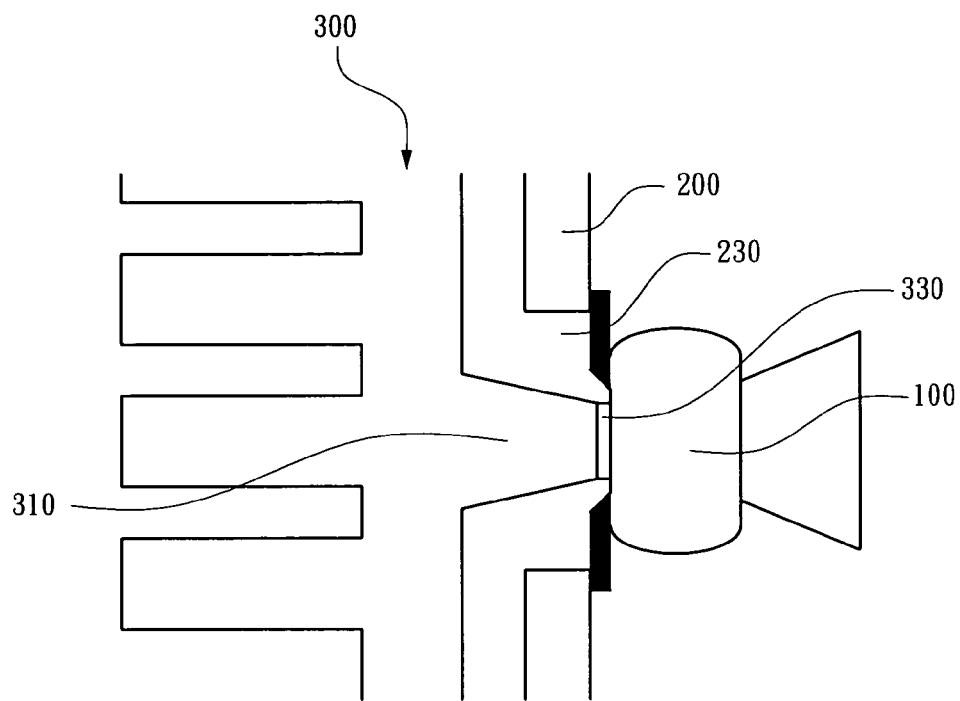
FIG. 4 illustrates a cross-sectional view of a backlight module in accordance with the second preferred embodiment of the present invention.

FIG. 4 illustrates a cross-sectional view of a backlight module in accordance with the second preferred embodiment of the present invention. In the present embodiment, each light-emitting element 100 is electrically connected to the inner surface of the baseboard 200 by a connecting portion, wherein the inner surface of the baseboard 200 is opposite to the heat-dispersing member 300. The protrusion portions 310 of the heat-dispersing member 300 pass through the through-holes 230 to contact with the light-emitting elements 100. There is a distance between the baseboard 200 and the heat-dispersing member 300 allowing air to flow through to enable more efficient heat dispersion. Alternatively, the distance may be eliminated to make the baseboard 200 adjacent to the heat-dispersing member 300 (not shown).

Figure 5:
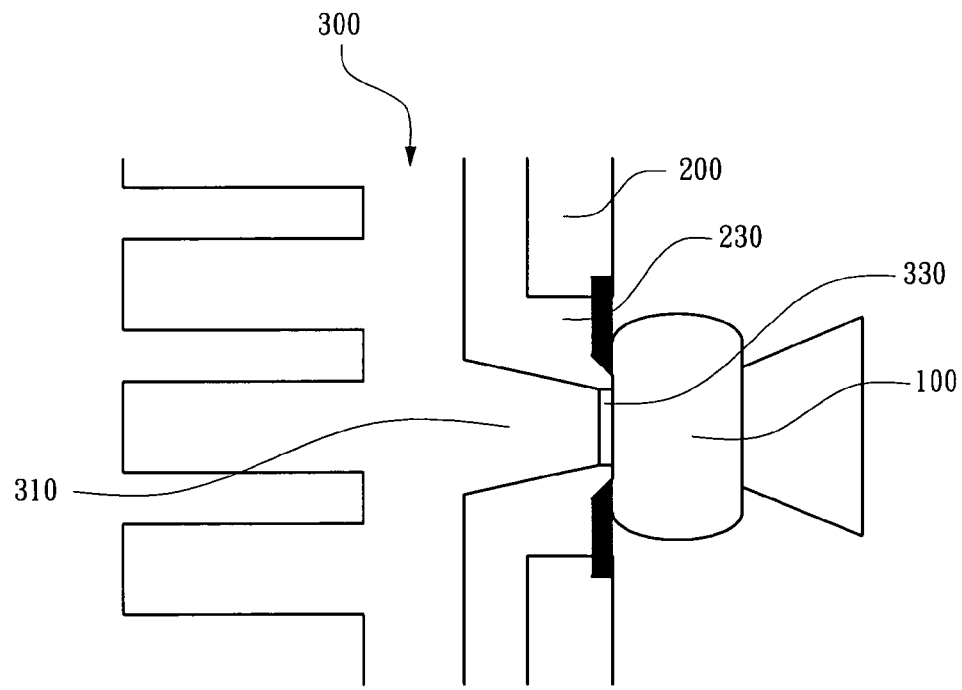
FIG. 5 illustrates another cross-sectional view of a backlight module in accordance with the second preferred embodiment of the present invention.

Referring to FIG. 4, the electrically connecting portion of the light-emitting elements 100 protrudes out of the inner surface of the baseboard 200 to affect the coating of the reflecting materials on the baseboard 200 such that emitted light fails to reflect and results in an uneven illumination. To resolve this, a baseboard 200 having stair-shaped recesses is provided such that the electrically connecting portions do not protrude from the inner surface of the baseboard 200, as shown in FIG. 5, to result in an even illumination.

In accordance with the described embodiments, the advantages of the present invention are as follows:

1. The light-emitting elements connected to the heat-dispersing member directly can avoid using additional thermal media to reduce the thermal resistance therebetween and improve heat dissipation effect.

2. A single baseboard that integrates various circuits thereon can replace the several baseboards with circuits required of the prior art, thus reducing the manufacture cost and minimizing the thickness of the display panel.

3. The integration of circuits can resolve the problems resulting from the complex arrangement of the connecting wires therebetween.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A backlight module comprising:
   a baseboard, having at least one through-hole;
   at least one light-emitting element, electrically connected to a surface of the baseboard via at least one electrically connecting portion of the light-emitting element; and
   a heat-dispersing member, adjacent to the baseboard and having a distance separated from the baseboard, wherein the heat-dispersing member comprises at least one heat-dispersing fin and at least one protrusion portion in contact with the light-emitting element by the through-hole.

2. The backlight module in accordance with claim 1, further comprising a first thermally conductive and electrically insulating material disposed between the light-emitting element and the protrusion portion.

3. The backlight module in accordance with claim 1, wherein the protrusion portion contacts an area of the light-emitting element that does not emit light from the light-emitting element.

4. The backlight module in accordance with claim 1, further comprising a dark shield surrounding the baseboard, wherein the baseboard and the dark shield define a box structure in which an inner surface of the box structure is coated with a reflecting material used to reflect the emitted light toward a desired direction.

5. The backlight module in accordance with claim 1, wherein the light-emitting element is installed in the through-hole and the surface of the baseboard electrically connected to the light-emitting element faces the heat-dispersing member.

6. The backlight module in accordance with claim 5, wherein the surface is an outer surface of the baseboard.

7. The backlight module in accordance with claim 5, wherein a distance is formed between the heat-dispersing member and the electrically connecting portion of the light-emitting element to make air flow through.

8. The backlight module in accordance with claim 5, further comprising a second thermally conductive and electrically insulating material disposed between the heat dispersing member and the electrically connecting portion of the light-emitting element.

9. The backlight module in accordance with claim 1, wherein the light-emitting element comprises a light-emitting diode.

10. The backlight module in accordance with claim 1, wherein the surface of the baseboard electrically connected to the light-emitting element is opposite to the heat-dispersing member.

11. The backlight module in accordance with claim 10, wherein the surface is an inner surface of the baseboard.

12. The backlight module in accordance with claim 10, wherein the protrusion portion passes through the through-hole.

13. The backlight module in accordance with claim 10, wherein the baseboard has a stair-shaped recess provided for the electrically connecting portions connecting the baseboard to the light-emitting element.

14. The backlight module in accordance with claim 1, wherein the baseboard is made of nonconductive materials.

15. The backlight module in accordance with claim 1, wherein the baseboard comprises a multi-tiered structure.

16. The backlight module in accordance with claim 1, further comprising a circuit for driving the light-emitting element and a circuit for driving a panel integrated on the baseboard.

* * * * *